United States Patent
Ozdemir

(10) Patent No.: US 8,379,340 B2
(45) Date of Patent: *Feb. 19, 2013

(54) CIRCUIT AND METHOD FOR DETECTING THE PHASE OF A SERVO SIGNAL

(75) Inventor: Hakan Ozdemir, San Jose, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/882,917

(22) Filed: Sep. 15, 2010

(65) Prior Publication Data

US 2011/0002061 A1    Jan. 6, 2011

Related U.S. Application Data

(63) Continuation of application No. 09/993,779, filed on Nov. 5, 2001, now Pat. No. 7,830,630.

(60) Provisional application No. 60/301,490, filed on Jun. 28, 2001.

(51) Int. Cl.
  *G11B 5/09* (2006.01)

(52) U.S. Cl. .............. 360/40; 360/46; 360/65; 714/792; 714/795; 714/796; 375/341

(58) Field of Classification Search .................. None
  See application file for complete search history.

(56) References Cited

U.S. PATENT DOCUMENTS

| | | | |
|---|---|---|---|
| 3,691,543 A | 9/1972 | Mueller | |
| 4,208,679 A | 6/1980 | Hertrich | |
| 4,424,543 A | 1/1984 | Lewis et al. | |
| 4,549,232 A | 10/1985 | Axmear et al. | |
| 4,920,434 A | 4/1990 | Brown et al. | |
| 4,979,055 A | 12/1990 | Squires et al. | |
| 5,036,408 A | 7/1991 | Leis et al. | |
| 5,065,262 A | 11/1991 | Blackborow et al. | |
| 5,216,343 A | 6/1993 | Genheimer et al. | |
| 5,255,136 A | 10/1993 | Machado et al. | |
| 5,257,272 A * | 10/1993 | Fredrickson | 714/792 |
| 5,291,464 A | 3/1994 | Osada | |
| 5,345,342 A | 9/1994 | Abbott et al. | |
| 5,375,145 A | 12/1994 | Abbott et al. | |
| 5,379,166 A | 1/1995 | Tsukada et al. | |
| 5,381,359 A | 1/1995 | Abbott et al. | |
| 5,384,671 A | 1/1995 | Fisher | |
| 5,424,881 A | 6/1995 | Behrens et al. | |
| 5,430,582 A | 7/1995 | Hayashi | |
| 5,442,499 A | 8/1995 | Emori | |

(Continued)

FOREIGN PATENT DOCUMENTS

| | | |
|---|---|---|
| EP | 0341852 | 11/1989 |
| EP | 1271512 | 2/2003 |

(Continued)

OTHER PUBLICATIONS

European Search Report for European Patent Application No. 02253885 dated Oct. 27, 2006.

(Continued)

*Primary Examiner* — Dismery Mercedes
(74) *Attorney, Agent, or Firm* — Graybeal Jackson LLP

(57) ABSTRACT

A detector recovers servo data from a servo signal generated by a read-write head, and determines the head-connection polarity from the recovered servo data. Such a detector allows a servo circuit to compensate for a reversed-connected read-write head, and thus allows a manufacturer to forego time-consuming and costly testing to determine whether the head is correctly connected to the servo circuit.

21 Claims, 8 Drawing Sheets

U.S. PATENT DOCUMENTS

| | | | | |
|---|---|---|---|---|
| 5,576,904 | A | 11/1996 | Behrens | |
| 5,608,583 | A | 3/1997 | Shrinkle | |
| 5,650,887 | A | 7/1997 | Dovek et al. | |
| 5,661,760 | A * | 8/1997 | Patapoutian et al. | 375/341 |
| 5,689,532 | A * | 11/1997 | Fitzpatrick | 375/341 |
| 5,754,356 | A | 5/1998 | Honjo et al. | |
| 5,757,576 | A | 5/1998 | Kosugi | |
| 5,796,535 | A | 8/1998 | Tuttle et al. | |
| 5,796,543 | A | 8/1998 | Ton-That | |
| 5,812,336 | A | 9/1998 | Spurbeck et al. | |
| 5,818,655 | A | 10/1998 | Satoh et al. | |
| 5,818,659 | A | 10/1998 | Cheung et al. | |
| 5,822,143 | A | 10/1998 | Cloke et al. | |
| 5,844,741 | A | 12/1998 | Yamakawa et al. | |
| 5,862,005 | A | 1/1999 | Leis et al. | |
| 5,872,666 | A | 2/1999 | Saiki et al. | |
| 5,909,336 | A | 6/1999 | Schaffner et al. | |
| 5,923,713 | A * | 7/1999 | Hatakeyama | 375/341 |
| 5,966,258 | A | 10/1999 | Bliss | |
| 5,970,104 | A * | 10/1999 | Zhong et al. | 375/341 |
| 6,031,672 | A | 2/2000 | Bergquist et al. | |
| 6,032,284 | A | 2/2000 | Bliss | |
| 6,038,097 | A | 3/2000 | Le et al. | |
| 6,052,248 | A | 4/2000 | Reed et al. | |
| 6,078,445 | A | 6/2000 | Serrano et al. | |
| 6,084,741 | A | 7/2000 | Kim | |
| 6,091,699 | A | 7/2000 | Nakane et al. | |
| 6,108,151 | A | 8/2000 | Tuttle et al. | |
| 6,108,153 | A | 8/2000 | Glover | |
| 6,115,198 | A | 9/2000 | Reed et al. | |
| 6,122,117 | A | 9/2000 | Aikawa | |
| 6,122,131 | A | 9/2000 | Jeppson | |
| 6,144,513 | A | 11/2000 | Reed et al. | |
| 6,148,043 | A * | 11/2000 | Fujimoto | 375/341 |
| 6,181,505 | B1 | 1/2001 | Sacks et al. | |
| 6,201,652 | B1 * | 3/2001 | Rezzi et al. | 360/40 |
| 6,233,715 | B1 | 5/2001 | Kuki et al. | |
| 6,239,934 | B1 | 5/2001 | Sun et al. | |
| 6,262,857 | B1 | 7/2001 | Hull et al. | |
| 6,295,175 | B1 | 9/2001 | Tomita et al. | |
| 6,295,176 | B1 | 9/2001 | Reddy et al. | |
| 6,304,538 | B1 | 10/2001 | Hayashi | |
| 6,324,030 | B1 | 11/2001 | Cheung et al. | |
| 6,324,226 | B1 * | 11/2001 | Sasagawa | 375/341 |
| 6,327,105 | B1 | 12/2001 | DeForest | |
| 6,347,390 | B1 | 2/2002 | Ino | |
| 6,366,225 | B1 | 4/2002 | Ozdemir | |
| 6,366,418 | B1 * | 4/2002 | McEwen et al. | 360/48 |
| 6,369,969 | B1 | 4/2002 | Christiansen et al. | |
| 6,378,107 | B1 * | 4/2002 | Yoshinaka | 714/795 |
| 6,400,288 | B1 | 6/2002 | Fredrickson et al. | |
| 6,426,845 | B1 | 7/2002 | Sacks et al. | |
| 6,433,948 | B1 | 8/2002 | Lee | |
| 6,477,125 | B1 | 11/2002 | Hayami | |
| 6,480,984 | B1 * | 11/2002 | Aziz | 714/795 |
| 6,487,672 | B1 | 11/2002 | Byrne et al. | |
| 6,490,110 | B2 | 12/2002 | Reed et al. | |
| 6,492,918 | B1 | 12/2002 | Rezzi et al. | |
| 6,507,447 | B1 | 1/2003 | Takahashi | |
| 6,519,107 | B1 | 2/2003 | Ehrlich et al. | |
| 6,519,109 | B1 | 2/2003 | Price et al. | |
| 6,534,974 | B1 | 3/2003 | Bowen et al. | |
| 6,560,054 | B1 | 5/2003 | Ottesen et al. | |
| 6,580,573 | B1 | 6/2003 | Hull et al. | |
| 6,604,204 | B1 * | 8/2003 | Ozdemir et al. | 713/400 |
| 6,606,728 | B1 | 8/2003 | Aziz | |
| 6,639,748 | B1 | 10/2003 | Christiansen et al. | |
| 6,650,614 | B1 | 11/2003 | Pietruszynski et al. | |
| 6,657,800 | B1 * | 12/2003 | Ozdemir et al. | 360/40 |
| 6,662,338 | B1 * | 12/2003 | Rezzi et al. | 714/795 |
| 6,665,138 | B1 | 12/2003 | Kim | |
| 6,680,807 | B1 | 1/2004 | She et al. | |
| 6,735,724 | B1 * | 5/2004 | McClellan | 714/704 |
| 6,738,205 | B1 | 5/2004 | Moran et al. | |
| 6,775,084 | B1 | 8/2004 | Ozdemir et al. | |
| 6,778,345 | B1 | 8/2004 | Ozdemir | |
| 6,813,744 | B1 * | 11/2004 | Traeber | 714/795 |
| 6,856,480 | B2 | 2/2005 | Kuki et al. | |
| 6,867,941 | B1 | 3/2005 | Ozdemir | |
| 6,909,567 | B2 | 6/2005 | McClellan et al. | |
| 6,942,918 | B2 | 9/2005 | MacDougall et al. | |
| 7,027,247 | B2 | 4/2006 | Heydari et al. | |
| 7,061,704 | B2 | 6/2006 | Dunn | |
| 7,206,149 | B2 | 4/2007 | Ozdemir | |
| 7,290,200 | B2 * | 10/2007 | Ozdemir | 714/795 |
| 7,382,568 | B2 | 6/2008 | Ozdemir | |
| 7,423,827 | B2 | 9/2008 | Neville et al. | |
| 7,430,082 | B2 | 9/2008 | Heydari et al. | |
| 2003/0002189 | A1 | 1/2003 | Ozdemir | |
| 2003/0048560 | A1 | 3/2003 | Ozdemir | |
| 2003/0048562 | A1 | 3/2003 | Heydari et al. | |
| 2003/0053245 | A1 | 3/2003 | Ozdemir | |
| 2005/0157415 | A1 | 7/2005 | Chiang et al. | |

FOREIGN PATENT DOCUMENTS

| | | |
|---|---|---|
| WO | 99/60566 | 11/1999 |

OTHER PUBLICATIONS

"The Authoritative Dictionary of IEEE Standard Terms", 7th Ed., 2000, p. 638.

European Search Report for European Patent Application No. 02253867, dated Oct. 23, 2006.

Partial European Search Report for European Patent Application No. 02253868.0, dated Feb. 4, 2007.

European Search Report for European Patent Application No. 02253852, dated Aug. 26, 2006.

European Search Report Dated Aug. 28, 2003, for European Patent App. No. 02253882.

European Search Report Dated Aug. 28, 2003, for European Patent App. No. 02253883.

* cited by examiner

| TRACK 0 | 000 | 000000000000 |
| TRACK 1 | 001 | 000000000011 |
| TRACK 2 | 011 | 000000110011 |
| TRACK 3 | 010 | 000000110000 |
| TRACK 4 | 110 | 001100110000 |
| TRACK 5 | 111 | 001100110011 |
| TRACK 6 | 101 | 001100000011 |
| TRACK 7 | 100 | 001100000000 |
|         | 132 | 130          |

CIRCUIT AND METHOD FOR DETECTING THE PHASE OF A SERVO SIGNAL

PRIORITY

The present application is a continuation of U.S. patent application Ser. No. 09/993,779, filed Nov. 5, 2001 now U.S. Pat. No. 7,830,630; which claims the benefit of U.S. Provisional Patent Application Ser. No. 60/301,490, filed Jun. 28, 2001, now expired; all of the foregoing applications are incorporated by reference herein in their entireties.

CROSS-REFERENCE TO RELATED APPLICATIONS

This application is related to commonly owned U.S. patent application Ser. Nos. 09/993,877 entitled "DATA-STORAGE DISK HAVING FEW OR NO SPIN-UP WEDGES AND METHOD FOR WRITING SERVO WEDGES ONTO THE DISK," 09/993,876 entitled "CIRCUIT AND METHOD FOR DETECTING A SERVO WEDGE ON SPIN UP OF A DATA-STORAGE DISK", "09/993,869 entitled "CIRCUIT AND METHOD FOR DETECTING A SPIN-UP WEDGE AND A CORRESPONDING SERVO WEDGE ON SPIN UP OF A DATA-STORAGE DISK", 09/994,009 entitled "A DATA CODE AND METHOD FOR CODING DATA", 09/993,986 entitled "CIRCUIT AND METHOD FOR DEMODULATING A SERVO POSITION BURST", 09/993,778 entitled "SERVO CIRCUIT HAVING A SYNCHRONOUS SERVO CHANNEL AND METHOD FOR SYNCHRONOUSLY RECOVERING SERVO DATA," which were filed on the same day as the present application and which are incorporated by reference.

TECHNICAL FIELD

The present disclosure is related generally to recovering data, and more particularly to a circuit and method for detecting the phase of a servo signal so that a servo circuit can compensate for a reverse-connected read head.

BACKGROUND

As computer-software applications become larger and more data intensive, disk-drive manufacturers often increase the data-storage capacities of data-storage disks by increasing the density of the stored servo and application data.

To increase the accuracy of a servo circuit as it reads the denser servo data from a data-storage disk, the manufacturer often codes the servo data. For example, as discussed below in conjunction with FIG. 4, the manufacturer may use a Gray code to code the servo data.

Unfortunately, if the manufacturer codes the servo data stored on a data-storage disk, then a disk drive that incorporates the disk often cannot incorporate conventional techniques—such as NRZ (Non Return to Zero)-NRZI (Non Return to Zero Interleave)-NRZ conversion—to compensate for a reverse-connected read head.

FIG. 1 is a plan view of a conventional disk drive 10, which includes a magnetic data-storage disk 12, a read-write head 14, an arm 16, and a voice-coil motor 18. The disk 12 is partitioned into a number—here eight—of disk sectors 20a-20h, and includes a number—typically in the tens or hundreds of thousands—of concentric data tracks 22a-22n. Readable-writable application data is stored in respective data sectors (not shown) within each track 22. Under the control of the disk drive's head-position circuit (not shown in FIG. 1), the motor 18 moves the arm 16 to center the head 14 over a selected track 22.

Referring to FIG. 2, conventional data servo wedges 24—only servo wedges 24a-24c are shown—include servo data that allows the head-position circuit (not shown in FIG. 2) of the disk drive 10 (FIG. 1) to accurately position the read-write head 14 (FIG. 1) during a data read or write operation. The servo wedges 24 are located within each track 22 at the beginning—the disk 12 spins counterclockwise in this example—of each disk sector 20. Each servo wedge 24 includes respective servo data that identifies the location (track 22 and sector 20) of the servo wedge. Thus, the head-position circuit uses this servo data to position the head 14 over the track 22 selected to be read from or written to. The manufacturer of the disk drive 10 typically writes the servo wedges 24 onto the disk 12 before shipping the disk drive to a customer; neither the disk drive nor the customer alters the servo wedges 24 thereafter. Servo wedges like the servo wedges 24 are further discussed below in conjunction with FIG. 3 and in commonly owned U.S. patent application Ser. No. 09/783,801, filed Feb. 14, 2001, entitled "VITERBI DETECTOR AND METHOD FOR RECOVERING A BINARY SEQUENCE FROM A READ SIGNAL," which is incorporated by reference.

FIG. 3 is a diagram of the servo wedge 24a of FIG. 2, the other servo wedges 24 being similar. Write splices 30a and 30b respectively separate the servo wedge 24a from adjacent data sectors (not shown). An optional servo address mark (SAM) 32 indicates to the head-position circuit (not shown in FIG. 3) that the read-write head 14 (FIG. 1) is at the beginning of the servo wedge 24a. A servo preamble 34 allows the servo circuit (not shown in FIG. 3) of the disk drive 10 (FIG. 1) to synchronize the sample clock to the servo signal (FIG. 5), and a servo synchronization mark (SSM) 36 identifies the beginning of a head-location identifier 38. The preamble 34 and SSM 36 are discussed in commonly owned U.S. patent application Ser. Nos. 09/993,877 entitled "DATA-STORAGE DISK HAVING FEW OR NO SPIN-UP WEDGES AND METHOD FOR WRITING SERVO WEDGES ONTO THE DISK," 09/993,876 entitled "CIRCUIT AND METHOD FOR DETECTING A SERVO WEDGE ON SPIN UP OF A DATA-STORAGE DISK", 09/993,869 entitled "CIRCUIT AND METHOD FOR DETECTING A SPIN-UP WEDGE AND A CORRESPONDING SERVO WEDGE ON SPIN UP OF A DATA-STORAGE DISK", 09/993,778 entitled "SERVO CIRCUIT HAVING A SYNCHRONOUS SERVO CHANNEL AND METHOD FOR SYNCHRONOUSLY RECOVERING SERVO DATA", which are incorporated by reference. The location identifier 38 allows the head-position circuit to coarsely determine and adjust the position of the head 14 with respect to the surface of the disk 12 (FIG. 1). More specifically, the location identifier 38 includes a sector identifier 40 and a track identifier 42, which respectively identify the disk sector 20 and the data track 22—here the sector 20a and the track 22a—that contain the servo wedge 24a. Because the head 14 may read the location identifier 38 even if the head is not centered over the track 24a, the servo wedge 24a also includes head-position bursts A-N, which allow the head-position circuit to finely determine and adjust the position of the head 14.

FIG. 4 is a table of the Gray coded bit patterns 50 that form portions of the respective track identifiers 42 (FIG. 3) for sixteen adjacent tracks 0-15 (FIG. 2) and the corresponding uncoded bit patterns 52. The uncoded patterns 52 for adjacent tracks differ by only one bit. For example, the only difference between the patterns 52 for the tracks 0 and 1 is that the least significant (rightmost) bit for track 0 is logic 0, and the least significant bit for track 1 is logic 1. Similarly, the Gray coded patterns 50 for adjacent tracks differ by only a pair of bits, or a one-bit shift in a pair of logic 1's. For example, the only difference between the patterns 50 for the tracks 0 and 1 is that the pair of least significant bits for track 0 are logic 0, and the pair of least significant bits for track 1 are logic 1. Moreover, the only difference between the patterns 50 for tracks 2 and 3 are that the pair of least significant logic 1's in the pattern 50 for track 2 are shifted left by one bit in the pattern 50 for track 3.

Still referring to FIG. 4, the Gray coded patterns 50 allow the head-position circuit (not shown in FIG. 4) to determine the position of the read-write head 14 (FIG. 1) within ±1 track. More specifically, the tracks 22 (FIG. 1) are typically so close together that the head 14 often simultaneously picks up servo data from multiple tracks 22, particularly if the head is between two tracks 22. Consequently, the Gray coded patterns 50 are designed so that if the head 14 is between two tracks 22, it generates a servo signal (not shown in FIG. 4) that ideally represents the Gray coded pattern 50 of the closest of these two tracks, but of no other track. For example, if the head 14 is between tracks 2 and 3 but closer to the center of track 2 than to the center of track 3, then the servo signal ideally represents the coded pattern 50 in track 2. If there is noise or another disturbance on the servo signal, however, then a servo circuit (not shown in FIG. 4) may read the servo signal as representing track 3, hence the ±1 track accuracy in the position of the head 14. The head-position circuit uses this head-position information derived from the servo signal to position the head 14 over a desired track 22. Once the head-position circuit positions the head 14 over a desired track 22 such that the servo signal represents the pattern 50 of the desired track, the head-position circuit uses bursts A-N (FIG. 3) to center the head 14 over the desired track.

Referring again to FIG. 1, during the manufacture of the disk drive 10 the head 14 may be reverse connected, in which case it reverses the phase of, i.e., inverts, the servo data as it reads a servo wedge 24 (FIG. 2). Although not shown, the head 14 typically has two leads that are coupled to a servo circuit (not shown in FIGS. 1-4). The person or machine that assembles the disk-drive 10 may reverse the leads. If the leads are reversed, then the head 14 will invert the servo signal, and thus the servo data. Consequently, if left uncorrected, the inverted servo data may cause the disk drive 10 to malfunction. Although the manufacture can test the disk drive 10 and reconnect the head leads if they are reversed, such testing is often costly and time consuming.

As discussed above, techniques such as NRZ-NRZI-NRZ conversion are often used to compensate for a reverse-connected read-write head 14. For example, the NRZ-NRZI-NRZ conversion converts data from one state to another such that the polarity of the resulting data recovered from the disk 12 (FIG. 1) is the same whether the leads of the head 14 are properly or reverse connected. That is, NRZ-NRZI-NRZ conversion eliminates the need to test the head connection because the recovered data has the correct polarity regardless of the polarity of the connection.

Unfortunately, referring to FIG. 4, NRZ-NRZI-NRZ conversion cannot be used with the Gray coded patterns 50 because it will destroy the characteristics of the patterns 50 that allow the head-position circuit (not shown in FIGS. 1-4) to determine the position of the read-write head 14 (FIG. 1) with ±1 track accuracy.

SUMMARY

In one embodiment, a head-polarity detector includes a circuit for recovering servo data and a polarity determinator. The circuit recovers the servo data from a servo signal generated by a read-write head that is coupled to the circuit with a coupling polarity. The determinator determines the coupling polarity from the recovered servo data.

Such a detector allows a servo circuit to compensate for a reversed-coupled read-write head, and thus allows a manufacturer to forego time-consuming and costly testing of the head-connection polarity.

DETAILED DESCRIPTION

Figure 5:
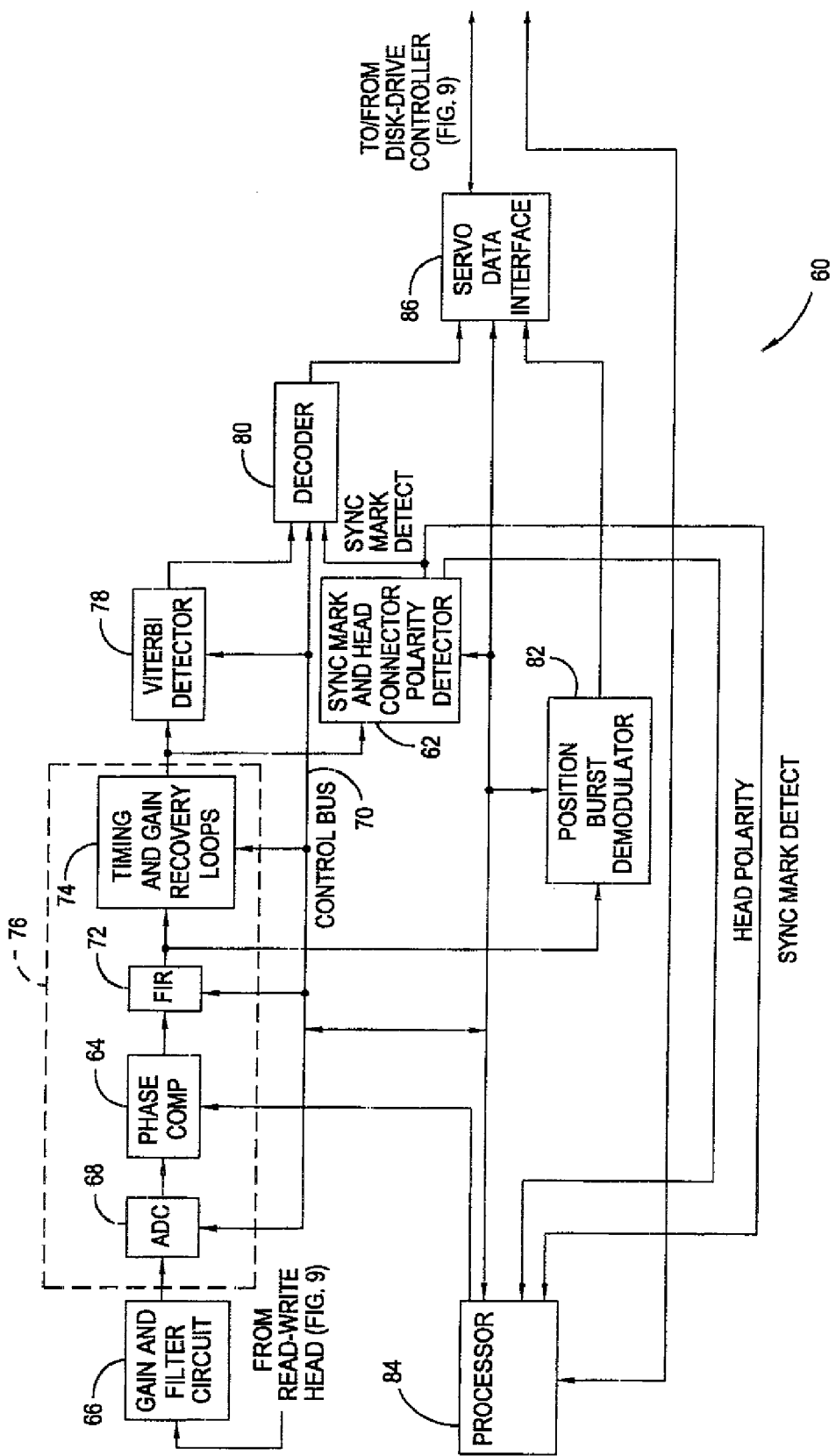
FIG. 5 is a block diagram of a servo circuit that can determine the polarity of a read-write head connection and can compensate the servo signal if the connection is reversed according to an embodiment.

FIG. 5 is block diagram of a synchronous servo circuit 60, which in accordance with an embodiment includes a synchronization-mark-and-polarity detector 62 for recovering a synchronization mark such as the sync mark of Table I below, determining the connection polarity of a read-write head (FIG. 9) from the recovered sync mark, and causing a phase-compensation circuit 64 to adjust the phase of the servo signal if the head connection is reversed. The detector 62 is further discussed below in conjunction with FIG. 6, and in one embodiment, the circuit 64 includes a conventional twos-compliment inverter.

Figure 9:
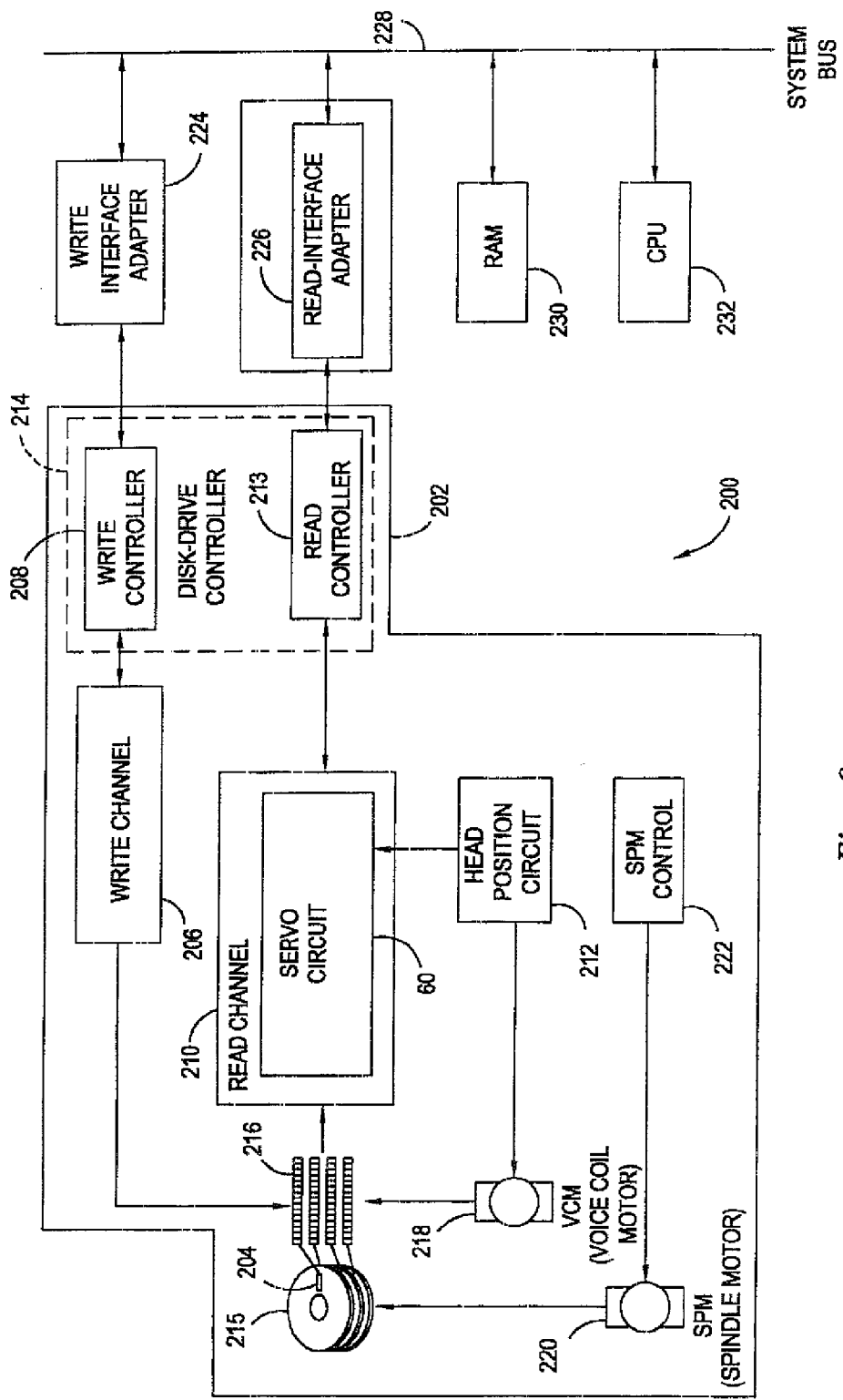
FIG. 9 is a block diagram of a disk-drive system that incorporates the servo circuit of FIG. 5 and that may incorporate the Gray coded track identifiers of FIG. 8 according to an embodiment.

The circuit 60 also includes a gain and filter circuit 66, which adjusts the gain of, filters, and equalizes the servo signal from the read-write head (FIG. 9). An analog-to-digital converter (ADC) 68 receives a sample clock (not shown) on a control bus 70 and generates digital samples of the servo signal from the circuit 66. A finite-impulse-response (FIR) filter 72 boosts the equalization of the samples received from the ADC 68 via the phase-compensation circuit 64, and timing and gain recovery loops 74 effectively synchronize the sample clock to the servo signal and maintain the gain of the circuit 60 at a desired level. The phase-compensation circuit 64, ADC 68, FIR 72, and loops 74 form a sample circuit 76. A Viterbi detector 78 recovers servo data, such as the location identifier 38 (FIG. 3), from the servo-signal samples generated by the loops 74. A decoder 80 decodes the recovered servo data from the Viterbi detector 78 in response to a Sync Mark Detect signal from the detector 62. A position-burst demodulator 82 receives samples of the servo signal from the FIR 72 and generates a head-position-error signal, and a processor 84 controls the components of the servo circuit 60 via the control bus 70. For example, the processor 84 causes the circuit 64 to invert the samples from the ADC 68 in response to a predetermined logic level of a Head Polarity signal from the detector 62. A servo-data interface 86 interfaces the decoder 80, demodulator 82, and processor 84 to a disk-drive controller (FIG. 9). Alternatively, as discussed below, depending on the scheme used to code the servo data, the circuit 60 may omit the Viterbi detector 78 and use the detector 62 to recover all of the servo data. Furthermore, although shown located between the ADC 68 and the FIR 72, the phase-compensation circuit 64 may be located elsewhere in the forward path of the servo circuit 60 such as at the input of the Viterbi detector 78.

Still referring to FIG. 5, the circuit 66, ADC 68, FIR 72, loops 74, Viterbi detector 78, decoder 80, processor 84, and the general operation of the servo circuit 60 are further discussed in previously incorporated U.S. patent application Ser. Nos. 09/993,877 entitled "DATA-STORAGE DISK HAVING FEW OR NO SPIN-UP WEDGES AND METHOD FOR WRITING SERVO WEDGES ONTO THE DISK," 09/993,876 entitled "CIRCUIT AND METHOD FOR DETECTING A SERVO WEDGE ON SPIN UP OF A DATA-STORAGE DISK", 09/993,869 entitled "CIRCUIT AND METHOD FOR DETECTING A SPIN-UP WEDGE AND A CORRESPONDING SERVO WEDGE ON SPIN UP OF A DATA-STORAGE DISK", 09/993,778 entitled "SERVO CIRCUIT HAVING A SYNCHRONOUS SERVO CHANNEL AND METHOD FOR SYNCHRONOUSLY RECOVERING SERVO DATA". The timing-recovery loop of the loops 74 is further discussed in commonly owned U.S. patent application Ser. No. 09/387,146, filed Aug. 31, 1999, entitled "DIGITAL TIMING RECOVERY USING BAUD RATE SAMPLING", which is incorporated by reference, and the gain-recovery loop of the loops 74 and the Viterbi detector 78 are also discussed in previously incorporated patent application Ser. No. 09/783,801, filed Feb. 14, 2001, entitled "VITERBI DETECTOR AND METHOD FOR RECOVERING A BINARY SEQUENCE FROM A READ SIGNAL". The burst demodulator 82 is discussed in previously incorporated U.S. patent application Ser. No. 09/993,986 entitled "CIRCUIT AND METHOD FOR DEMODULATING A SERVO POSITION BURST".

Figure 6:
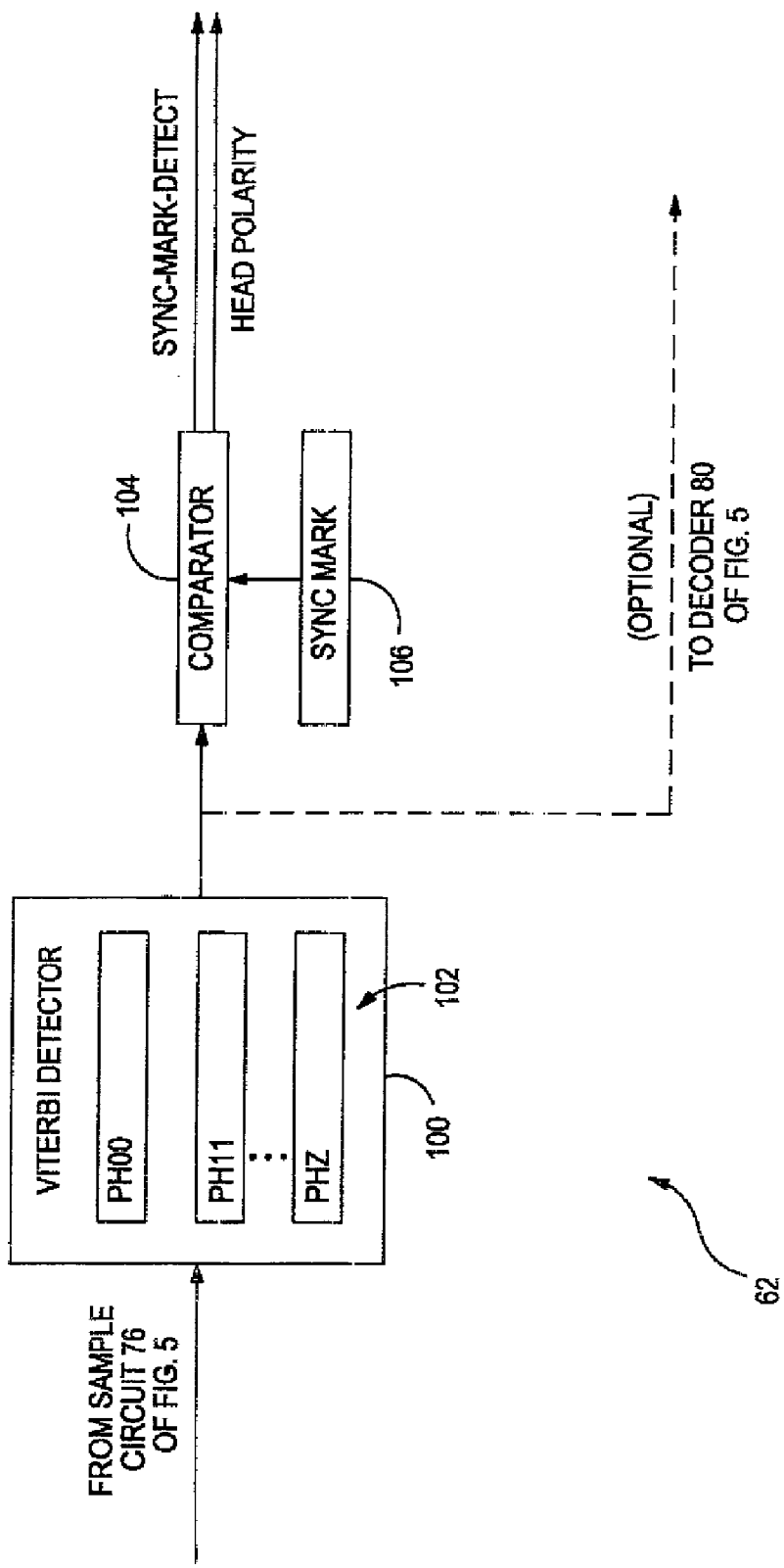
FIG. 6 is a block diagram of the synchronization-mark-and-polarity detector of FIG. 5 according to an embodiment.

FIG. 6 is a block diagram of the synchronization-mark-and-polarity detector 62 of FIG. 5 according to an embodiment. The detector 62 includes a polarity-independent Viterbi detector 100, which recovers the sync mark from the servo signal regardless of the head-connection polarity and which includes a bank 102 of path-history registers PH00-PHZ, one register for each state that the Viterbi detector 100 recognizes. A comparator 104 detects the sync mark and the head-connection polarity by comparing the recovered servo data from the Viterbi detector 100 with the noninverted version of the sync mark stored in a register 106. The comparator 104 generates the Sync Mark Detect signal having one logic level when it detects the sync mark and another logic level otherwise, and generates the Head Polarity signal having one logic level when the head is properly coupled to the servo circuit 60 (FIG. 5) and another logic level when the head connection is inverted. Alternatively, where the Viterbi detector 78 (FIG. 5) is omitted, the servo circuit 60 (FIG. 5) uses the Viterbi detector 100 to recover all of the servo data and to provide the recovered servo data to the decoder 80.

Referring to FIGS. 5 and 6, the operation of the servo circuit 60 and the sync-mark-and-polarity detector 62 according to an embodiment is discussed.

Figure 3:
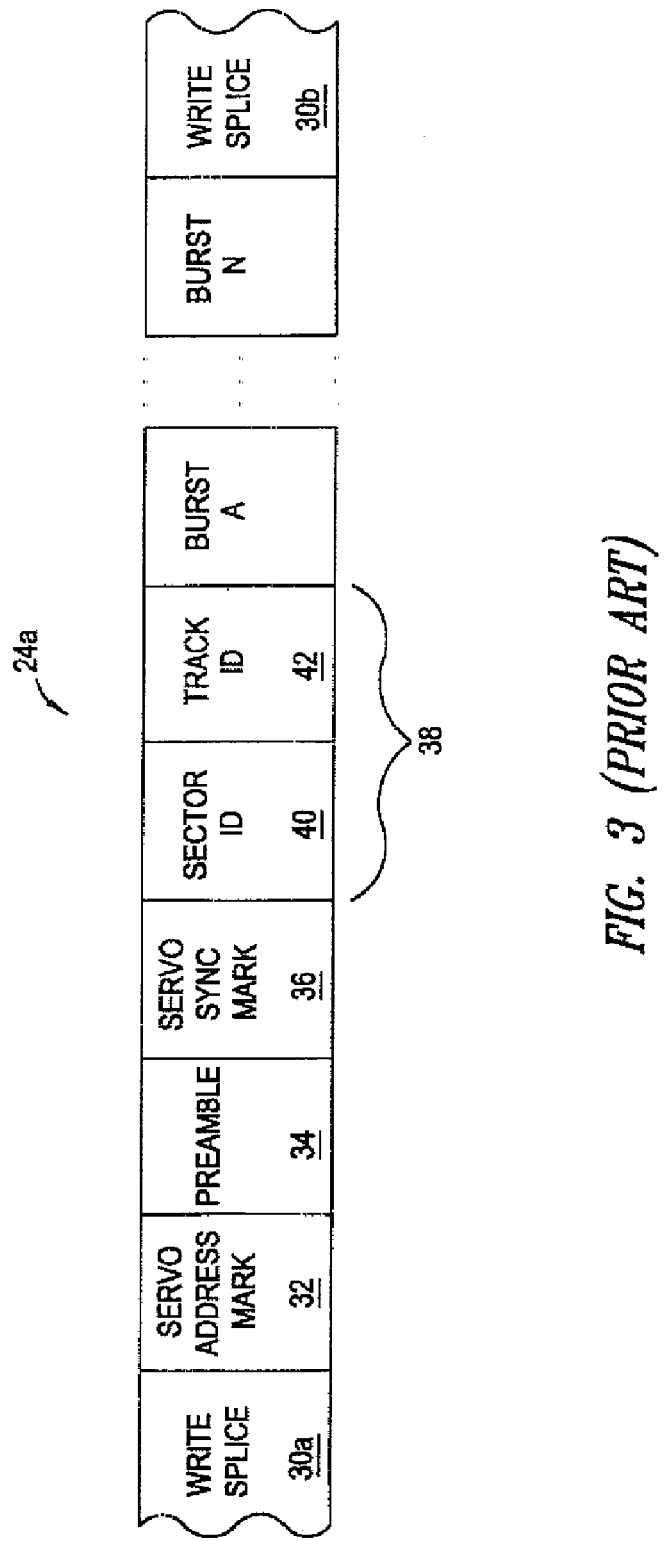
FIG. 3 is a diagram of a servo wedge of FIG. 2.
Figure 4:
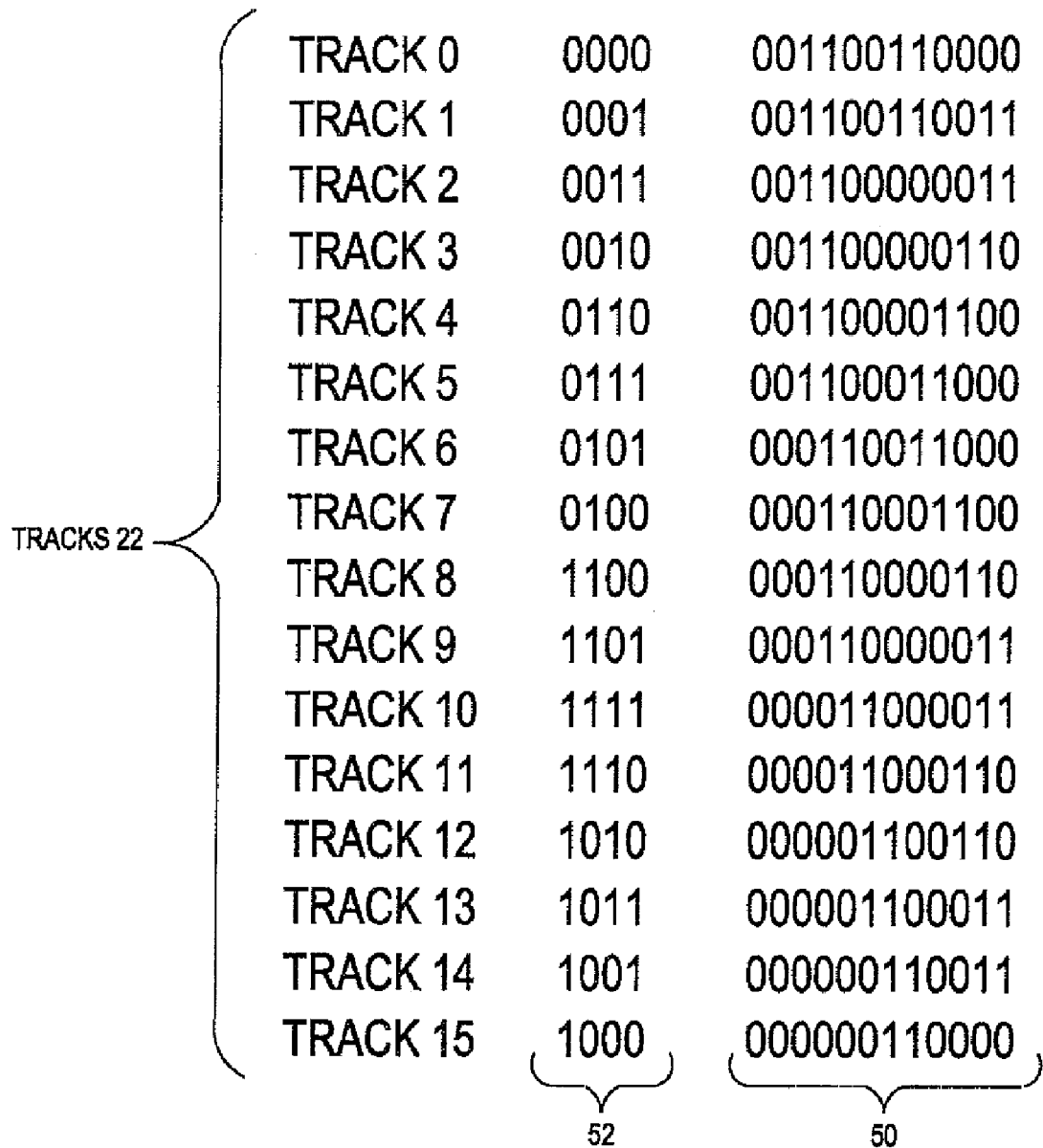
FIG. 4 is a table of conventional Gray coded track identifiers and the corresponding uncoded track identifiers for adjacent tracks on the disk of FIG. 1.

At the beginning of a read or write cycle, the servo circuit 60 synchronizes itself to the preamble of a servo wedge such as the preamble 34 of the servo wedge 24*a* (FIG. 3). Specifically, while the read-write head (FIG. 9) is reading the preamble, the processor 84 causes the timing and gain recovery loops 74 to effectively synchronize the sample clock such that the ADC 68 samples the preamble at appropriate times. This synchronization is further discussed in commonly owned U.S. patent application Ser. No. 09/387,146, filed Aug. 31, 1999, entitled "DIGITAL TIMING RECOVERY USING BAUD RATE SAMPLING", which is incorporated by reference.

When the circuit 60 is synchronized, the processor 84 enables the detector 62 to search for and detect the sync mark and the head-connection polarity. During this search, the comparator 104 compares the recovered servo data from the Viterbi detector 100 to the stored sync mark on a bit-by-bit basis. If and when the number of the recovered servo bits that match the corresponding bits of the stored sync mark is greater than or equal to a first predetermined threshold or less than or equal to a second predetermined threshold, then the comparator transitions the Sync Mark Detect signal to an active logic level to indicate that it has detected the sync mark. Furthermore, the comparator 104 transitions the Head Polarity signal to one logic level if the number of matched bits is greater than or equal to the first threshold, and transitions to the Head Polarity signal to another logic level if the number of matched bits is less than or equal to the second threshold. In one embodiment, the detector 62 allows the manufacturer to program the first and second predetermined thresholds to desired values. Furthermore, as discussed above in conjunction with FIG. 6 and below in conjunction with FIGS. 7A-7C, the Viterbi detector 100 is phase independent such that it can recover the sync mark from the servo data regardless of the connection polarity of the read-write head.

More specifically, the detector 62 detects the sync mark and determines the head-connection polarity according to the following algorithm:

$$\text{If} \sum_{i=0}^{SM\_length-1} SM(i) \oplus SM\_recovered(i) \geq SM\_length - \text{Threshold}$$

Then INV=1 (to indicate that this first comparison indicates recovery of the sync mark and that the head connection is inverted);

Else, INV=0 (to indicate that this first comparison does not indicate recovery of the sync mark and does not provide an indication of the head-connection polarity); and $$\text{If} \sum_{i=0}^{SM\_length-1} SM(i) \oplus SM\_recovered(i) \leq \text{Threshold}$$

NINV=1 (to indicate that this second comparison indicates recovery of the sync mark and that the head connection is not inverted);

Else, NINV=0 (to indicate that this second comparison does not indicate recovery of the sync mark and does not provide an indication of the head-connection polarity).

where SM_length equals the number of bits in the sync mark, SM equals the sync mark stored in the register 106, SM_recovered equals the sync mark recovered from the Viterbi detector 100, Threshold is the second predetermined threshold discussed above, and SM-length−Threshold is the first predetermined threshold discussed above.

For example, if the SM_length=10, SM=0000110011, SM_recovered equals 0100110011, and Threshold=2, then the summation of the algorithm equals the following:

$$0\ominus 0+0\ominus 1+0\ominus 0+0\ominus 0+1\ominus 1+1\ominus 1+0\ominus 0+0\ominus 0+1\ominus 1+1\ominus 1=1 \quad (1)$$

Because 1<(Threshold=2)<(SM-length−Threshold=8), the comparator 104 sets INV=0 and NINV=1, which indicates that the circuit 62 has detected the sync mark and has determined that the head-connection polarity is not inverted. Consequently, the comparator 104 sets the Sync Mark Detect signal to a logic level that indicates that the sync mark is detected, and sets the Head Polarity signal to a logic level that indicates that the head connection is proper. In response to these logic levels, the processor 84 causes the phase compensator 64 to pass through the samples from the ADC 68 without altering the phase of the samples.

But if, for example, SM_recovered=1011001100, and the values of SM, SM-length, and Threshold are the same as above, then the summation of the algorithm equals the following:

$$0\ominus 1+0\ominus 0+0\ominus 1+0\ominus 1+1\ominus 0+1\ominus 0+0\ominus 1+0\ominus 1+1\ominus 0+1\ominus 0=9 \quad (2)$$

Because 9>(SM_length−Threshold=8)>(Threshold=2), the comparator 104 sets INV=1 and NINV=0, which indicates that the circuit 62 has detected the sync mark and has determined that the head-connection polarity is inverted. Consequently, the comparator 104 sets the Sync Mark Detect signal to the logic level that indicates that the sync mark is detected, and sets the Head Polarity signal to a logic level that indicates that the head connection is inverted. In response to these logic levels, the processor 84 causes the phase compensator 64 to invert the samples from the ADC 68. Alternatively, the manufacturer may disable the processor 84 from causing the compensator 64 to invert the samples, and instead swap the head leads in response to these logic levels so that the head is properly coupled to the servo circuit 60.

Alternatively, if SM_recovered=1001001101 and the values of SM, SM-length, and Threshold are the same as above, then the summation of the algorithm equals the following:

$$0\ominus 1+0\ominus 0+0\ominus 0+0\ominus 1+1\ominus 0+1\ominus 0+0\ominus 1+0\ominus 1+1\ominus 0+1\ominus 1=7 \quad (3)$$

Because (Threshold=2)<7<(SM_length−Threshold=8), the comparator 104 sets INV=NINV=0, which indicates that the circuit 62 has not detected the sync mark and has not determined the head-connection polarity. Consequently, the comparator 104 sets the Sync Mark Detect to a logic level that indicates that the sync mark has not been detected. In response to this logic level, the processor 84 ignores the Head Polarity signal and does not alter the setting (invert/noninvert) of the phase compensator 64 or instruct a technician to swap the head leads.

Although in the above examples one predetermined threshold (SM_length−Threshold) equals the difference between the length of the sync mark and the other predetermined threshold (Threshold), the one threshold may have a value that is independent of the other threshold. In one embodiment, the two thresholds are set based on the levels of noise and interference expected in the servo signal.

Still referring to FIGS. 5 and 6, because in one embodiment the Viterbi detector 78 recovers servo data following the sync mark—the location identifier 38 (FIG. 3) for example—before the detector 62 can determine the head-connection polarity, the decoder 80 discards the recovered servo data if the detector 62 determines that the head-connection polarity is reversed. This is because the detector 78 cannot properly recover inverted servo data. The processor 84 notifies the disk-drive controller (FIG. 9) that the decoder 80 has discarded servo data, and the controller instructs the servo circuit 60 to restart the read or write cycle with the phase compensator 64 inverting the samples of the servo signal. Because restarting a read or write cycle is inefficient, the manufacturer typically programs the disk-drive controller to cause the servo circuit 60 to determine the head-connection polarity and set the phase-compensation circuit 64 during startup of the disk drive (FIG. 9), and to thereafter disable the circuit 60 from determining the head-connection polarity. For example, the disk-drive controller may cause the processor 84 to store the value of the Head Polarity signal during startup, set the phase-compensation circuit 64 appropriately based on this stored polarity value, and thereafter maintain the setting of the circuit 64 and ignore the Head Polarity signal.

Conversely, in an embodiment where the servo data is coded such that the Viterbi detector 100 can recover both the sync mark and the other servo data, the polarity-detection capability of the comparator 104 can be omitted because the detector 100 is polarity independent. The servo circuit 60, however, may include a data inverter (not shown) between the detector 62 and the decoder 80, or at the output of the decoder 80, so that the recovered servo data will be in a proper form for the disk-drive controller (FIG. 9) if the head connection is inverted. An example of such a servo-data code is discussed below in conjunction with FIG. 8.

Figure 7A:
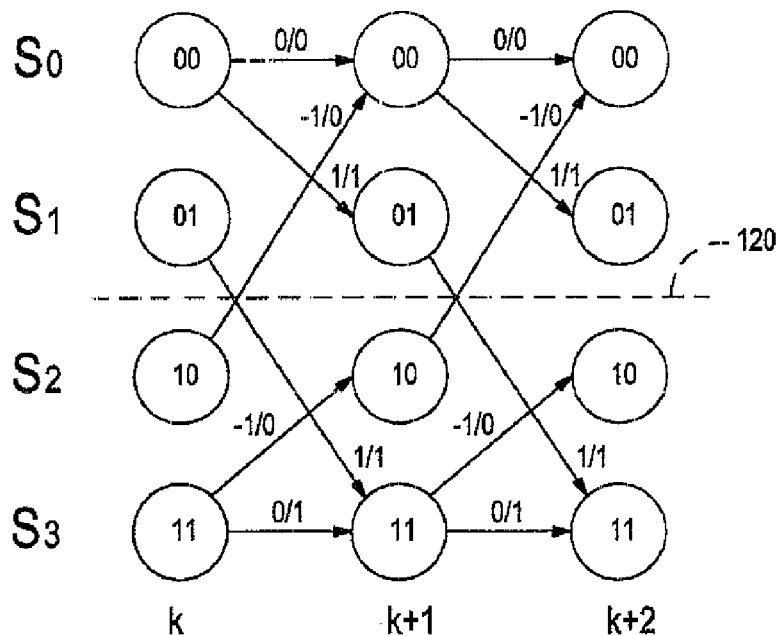
FIG. 7A is a one-sample-at-a-time trellis diagram for a pruned, non-time-varying version of the Viterbi detector of FIG. 6 according to an embodiment.

FIG. 7A is a one-state-at-a-time trellis diagram for the Viterbi detector 100 of FIG. 5 according to an embodiment where the sync mark includes pairs and only pairs of consecutive logic 1's that are separated by no fewer than two consecutive logic 0's. In one embodiment, the Viterbi detector 100 is a pruned, non-time-varying PR4 detector where the values to the left of the slashes are the ideal PR4 sample values, the values to the right of the slashes are the possible values of the most recent bit sampled, and k, k+1, and k+2 are the relative sample times. In one application, the sync mark has the bit pattern given in Table I.

TABLE I

| Sync Mark Bit Pattern |
| --- |
| 0000000011000000011000011 |

The bit scheme of the sync mark allows the Viterbi detector 100 to have a reduced number of possible state transitions, i.e., to be "pruned." Normally, each state S0-S3 of the trellis diagram would have two entering branches for a total of eight branches between the states at consecutive sample times. But with the restriction on the sync-mark bit pattern described above, there can be no state transition from S1 to S2 or from S2 to S1. Therefore, eliminating these two state transitions leaves only six branches between the states at consecutive sample times.

Furthermore, because the trellis of the Viterbi detector 100 is symmetrical about an imaginary horizontal axis 120 between states S1 and S2, the Viterbi detector 100 can recover the sync mark regardless of its polarity, and thus regardless of the head-connection polarity.

The fundamentals of Viterbi detectors and trellis diagrams are further discussed in commonly owned U.S. patent application Ser. No. 09/409,923, filed Sep. 30, 1999, entitled "PARITY-SENSITIVE VITERBI DETECTOR AND METHOD FOR RECOVERING INFORMATION FROM A READ SIGNAL", and 09/410,274, filed Sep. 30, 1999, entitled "CIRCUIT AND METHOD FOR RECOVERING SYNCHRONIZATION INFORMATION FROM A SIGNAL", which are incorporated by reference.

Figure 7B:
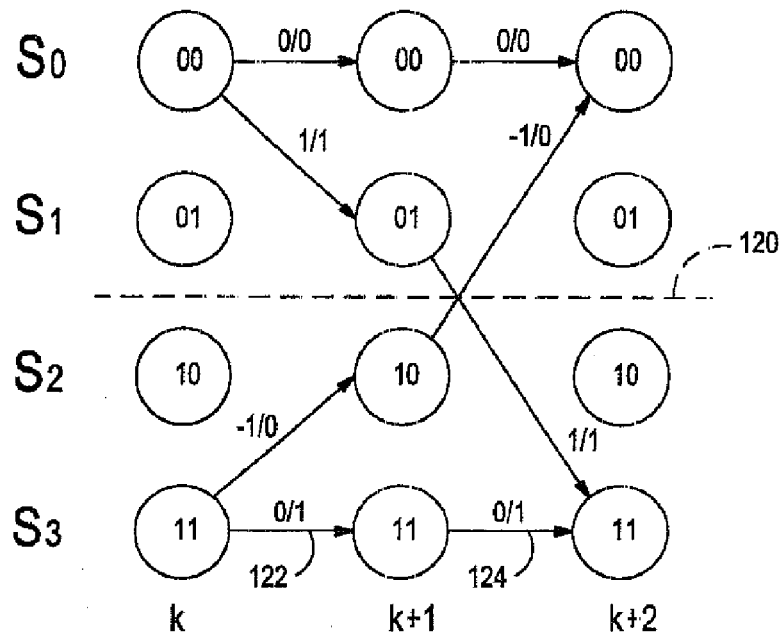
FIG. 7B is a one-sample-at-a-time trellis diagram for a pruned, time-varying version of the Viterbi detector of FIG. 6 according to an embodiment.

FIG. 7B is a one-state-at-a-time trellis diagram for the Viterbi detector 100 of FIG. 5 according to another embodiment where the sync mark includes pairs and only pairs of consecutive logic 1's that are separated by no fewer than two consecutive logic 0's. In one embodiment, the Viterbi detector 100 is a time-varying PR4 detector, and the sync mark has the bit pattern given in Table I above.

In addition to this embodiment of the Viterbi detector 100 being pruned like the FIG. 7A Viterbi detector, the sample clock is synchronized to the sync mark such that the detector 100 is time varying. More specifically, referring to Table I, the logic 0's and 1's of the sync mark always come in pairs. Therefore, at every other sample time, the only possible states of the sync mark are S0 or S3. Consequently, by identifying the first sample of the sync mark and configuring the detector 100 such that this first sample is aligned with the sample time k+1 of the trellis, the detector "knows" that at k and k+2 only states S0 and S3 are possible. Therefore, one can eliminate all branches entering states S1 and S2 at sample times k and k+2. But because the trellis between k and k+1 differs from the trellis between k+1 and k+2, the detector 100 is said to be time varying because the trellis depends on the sample time. Even so, because there are only four branches between the states at each consecutive sample time, the time-varying Viterbi detector is often less complex and more robust than the non-time-varying Viterbi detector discussed above in conjunction with FIG. 7A.

Furthermore, like the FIG. 7A Viterbi detector, this embodiment of the Viterbi detector 100 can recover the sync mark regardless of its polarity, and thus regardless of the head-connection polarity. Specifically, the trellis is symmetrical about the imaginary horizontal axis 120 between states S1 and S2. One may notice that because the sync mark of Table I has pairs and only pairs of logic 1's, the branches 122 and 124 can also be eliminated because the sync mark cannot have the state S3 at sample time k+1. But removing the branches 122 and 124 would destroy the symmetry about the imaginary axis 120, and would thus render the Viterbi detector 100 polarity dependent. That is, if the head-connection polarity were inverted, the detector 100 would be unable to recover the sync mark. Consequently, the servo circuit 60 would be unable to compensate for the inverted head-connection polarity.

Figures 7C, 8:
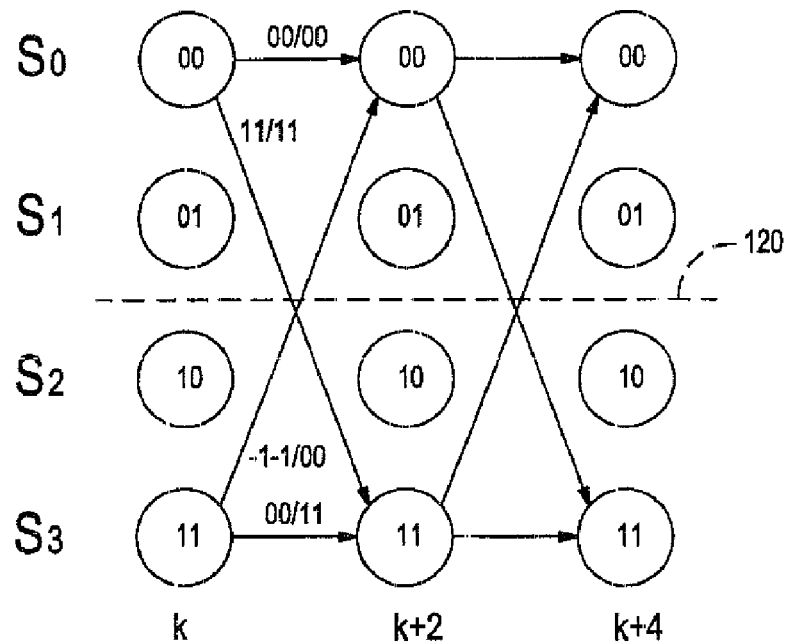
FIG. 7C is a two-sample-at-a-time version of the trellis diagram of FIG. 7B.
FIG. 8 is a table of Gray coded track identifiers and the corresponding uncoded track identifiers for adjacent tracks on a disk according to an embodiment.

FIG. 7C is a two-sample-at-a-time version of the one-sample-at-a-time trellis diagram of FIG. 7B. Specifically, in this embodiment the sample circuit 76, the Viterbi detector 78, and the Viterbi detector 100 process two samples of the servo signal at a time. Therefore, the trellis of FIG. 7C is merely the trellis of FIG. 7B modified to reflect that the Viterbi detector 100 processes two samples at a time. Furthermore, the Viterbi detector 100 is non-time-varying when it processes two samples at a time.

In one embodiment, the two-sample-at-a-time Viterbi detector 100 calculates a difference metric instead of path metrics, and updates the contents of the path history registers 102 based on the difference metric. Consequently, the Viterbi detector 100 can include circuitry that is less complex than would be needed if it calculated path metrics.

The calculation of the difference metric is derived from the following PR4 path-metric equations, which use the following variables: PM00 equals the path metric for the state S0, PM11 equals the path metric for the state S1, Yf equals the first sample of a pair of samples (corresponds to k, k+2, k+4), Ys equals the second sample of a pair of samples (corresponds to k+1 and k+3, which are not shown in FIG. 7C), DM equals the difference metric=½(PM00−PM11), and Yk=Yf+Ys. As discussed above, each sample of a pair of samples has the same value. That is each pair of samples is either 00 or 11. Thus, the complexity of the Viterbi detector 100 is equivalent to the complexity of a single interleaved PR4 detector.

If $PM00_k < PM11_k + (Yf+1)^2 + (Ys+1)^2$

Then $PM00_{k+1} = PM00_k$

Else $PM00_{k+1} = PM11_k + (Yf+1)^2 + (Ys+1)^2$ \hfill (4)

If $PM11_k < PM00_k + (Yf-1)^2 + (Ys-1)^2$

Then $PM11_{k+1} = PM11_k$

Else $PM11_{k+1} = PM00_k + (Yf-1)^2 + (Ys-1)^2$ \hfill (5)

Simplifying equations (4) and (5) to eliminate the square terms results in the following corresponding equations:

If $PM00_k < PM11_k + 2Yf + 2Ys + 2$

Then $PM00_{k+1} = PM00_k$

Else $PM00_{k+1} = PM11_k + 2Yf + 2Ys + 2$ \hfill (6)

If $PM11_k < PM00_k - 2Yf - 2Ys + 2$

Then $PM11_{k+1} = PM11_k$

Else $PM11_{k+1} = PM00_k - 2Yf - 2Ys + 2$ \hfill (7)

Simplifying equations (6) and (7) by incorporating DM and Yk in the inequalities results in the corresponding equations:

$Yk > DM_k - 1$ \hfill (8)

$Yk < DM_k + 1$ \hfill (9)

If equation (8) is false and equation (9) is true, then the Viterbi detector 100 updates DM and the path history registers PH00 and PH11 as follows, where 0 is the first (most recent) bit position and n is the last (least recent) bit position of the path registers:

$DM_{k+1} = Yk + 1$ \hfill (10)

$PH00(0:n)_{k+1} = [0,0,PH11(0:n-2)_k]$ \hfill (11)

$PH11(0:n)_{k+1} = [1,1,PH11(0:n-2)_k]$ \hfill (12)

That is, the Viterbi detector 100 loads logic 0's into the two most recent bit positions 0 and 1 of PH00 and loads the remaining bit positions 2−n with the contents of the corresponding bit positions 0−n−2 of PH11. Next, the Viterbi detector 100 loads logic 1's into the two most recent bit positions 0 and 1 of PH11 while or after PH11 shifts the contents of its bit positions 0−n−2 into its bit positions 2−n.

If equation (8) is true and equation (9) is false, then the Viterbi detector 100 updates DM and the path history registers PH00 and PH11 as follows:

$DM_{k+1} = Yk - 1$ \hfill (13)

$$PH00(0:n)_{k+1} = [0,0,PH00(0:n-2)_k] \quad (14)$$

$$PH11(0:n)_{k+1} = [1,1,PH00(0:n-2)_k] \quad (15)$$

That is, the Viterbi detector 100 loads logic 1's into the two most recent bit positions 0 and 1 of PH11 and loads the remaining bit positions 2–n with the contents of the corresponding bit positions 0–n–2 of PH00. Next, the Viterbi detector 100 loads logic 0's into the two most recent bit positions 0 and 1 of PH00 while or after PH00 shifts the contents of its bit positions 0–n–2 into its bit positions 2–n.

If both equations (8) and (9) are true, then the Viterbi detector 100 updates DM and the path history registers PH00 and PH11 as follows:

$$DM_{k+1} = DM_k \quad (16)$$

$$PH00(0:n)_{k+1} = [0,0,PH00(0:n-2)_k] \quad (17)$$

$$PH11(0:n)_{k+1} = [1,1,PH11(0:n-2)_k] \quad (18)$$

That is, when both equations (8) and (9) are true, the Viterbi detector 100 loads logic 0's into the two most recent bit positions 0 and 1 of PH00 while or after PH00 shifts the contents of its bit positions 0–n–2 into its bit positions 2–n. Similarly, the Viterbi detector 100 loads logic 1's into the two most recent bit positions 0 and 1 of PH11 while or after PH11 shifts the contents of its bit positions 0–n–2 into its bit positions 2–n.

Equations (8) and (9) cannot both be false.

Figure 2:
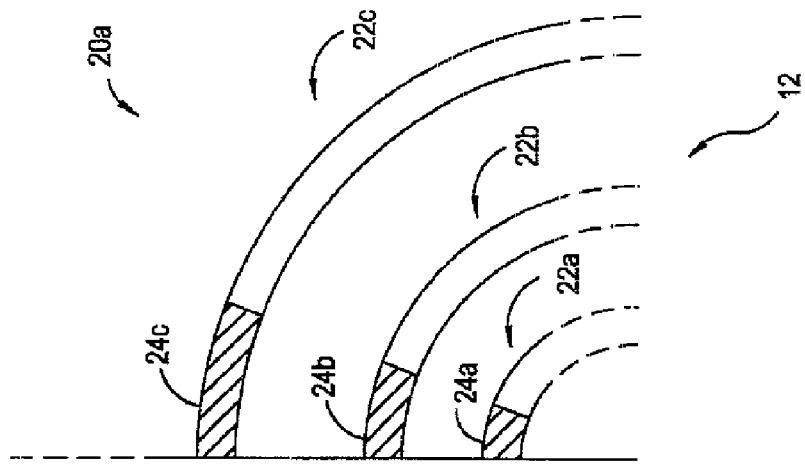
FIG. 2 is a magnified view of the servo wedges on the disk of FIG. 1.

FIG. 8 is a table of Gray coded bit patterns 130 that form portions of the respective track identifiers 42 (FIG. 3) for eight adjacent tracks 0-7 (FIG. 2), and the corresponding uncoded bit patterns 132 according to an embodiment. The Gray coded bit patterns 130 include pairs and only pairs of consecutive logic 1's that are separated by no fewer than two consecutive logic 0's; therefore, the bit patterns 130 are compatible with the embodiments of the Viterbi detector 100 discussed above in conjunction with FIGS. 5-7C. Because the bit patterns 130 are compatible with the Viterbi detector 100, they allow the manufacturer to simplify the servo circuit 60 (FIG. 5) by eliminating the Viterbi detector 78 and using the Viterbi detector 100 to recover all of the servo data as discussed above in conjunction with FIGS. 5 and 6. The coding scheme used to generate the Gray coded bit patterns 132 is discussed in commonly owned U.S. patent application Ser. No. 09/994,009 entitled "A DATA CODE AND METHOD FOR CODING DATA", which is incorporated by reference.

Figure 1:
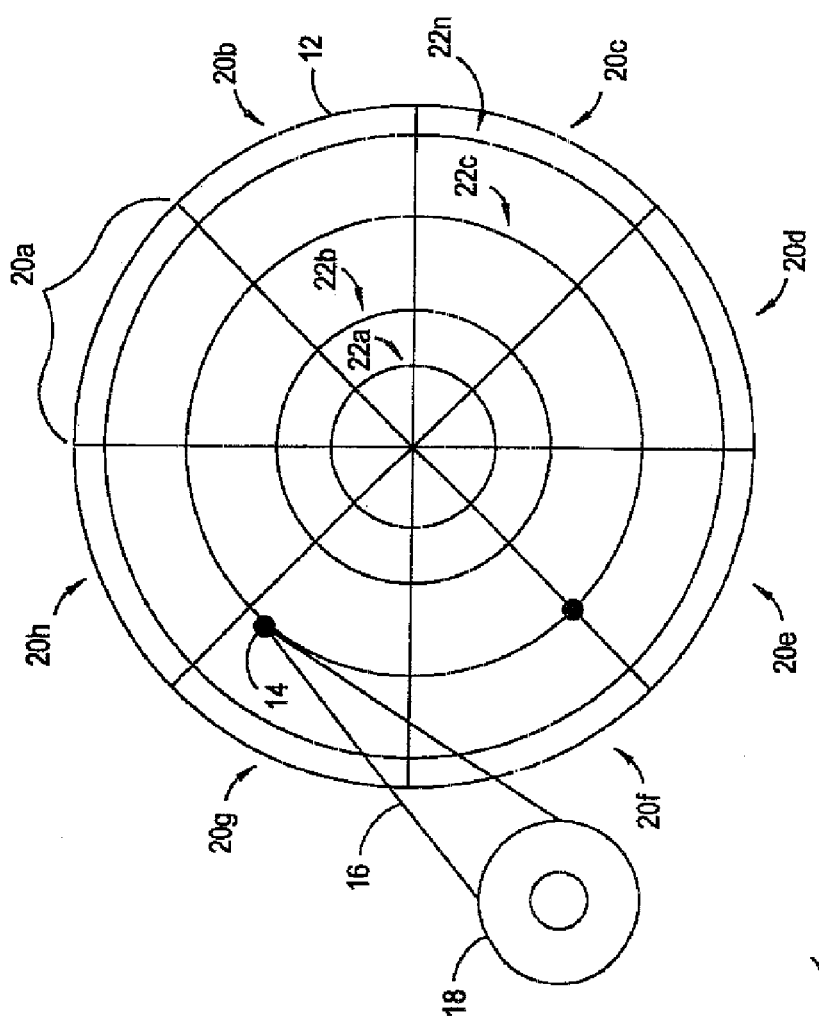
FIG. 1 is a plan view of a conventional disk drive that includes a magnetic data-storage disk having disk sectors and data tracks.

FIG. 9 is a block diagram of a disk-drive system 200 that incorporates the servo circuit 60 of FIG. 5 according to an embodiment. The disk-drive system 200 includes a disk drive 202, which includes a read-write head 204, a write channel 206 for generating and driving the head 204 with a write signal, and a write controller 208 for interfacing the write data to the write channel 206. The head 204 may be similar to the head 14 of FIG. 1. The disk drive 202 also includes a read channel 210, which incorporates the servo circuit 60 (FIG. 5) for receiving a servo signal from the head 204 and for recovering servo data therefrom, and for providing the recovered servo data to a head-position circuit 212. The read channel 210 also receives an application-data read signal and recovers application data therefrom. The disk drive 202 also includes a read controller 213 for organizing the read data. Together, the write and read controllers 208 and 213 compose a disk-drive controller 214. The disk drive 202 further includes a storage medium such as one or more disks 215, each of which may contain data on one or both sides and which may be a magnetic, optical, or another type of storage disk. For example, the disks 215 may be similar to the disk 12 of FIG. 1. The head 204 writes/reads the data stored on the disks 215, and is coupled to a movable support arm 216, which may be similar to the support arm 16 of FIG. 1. The head-position circuit 212 provides a control signal to a voice-coil motor (VCM) 218, which positionally maintains/radially moves the arm 216 so as to positionally maintain/radially move the head 204 over the desired data tracks on the disks 215. The VCM 218 may be similar to the VCM 18 of FIG. 1. A spindle motor (SPM) 220 and a SPM control circuit 222 respectively rotates the disks 215 and maintains them at the proper rotational speed.

The disk-drive system 200 also includes write and read interface adapters 224 and 226 for respectively interfacing the disk-drive controller 214 to a system bus 228, which is specific to the system used. Typical system busses include ISA, PCI, S-Bus, Nu-Bus, etc. The system 200 typically has other devices, such as a random access memory (RAM) 230 and a central processing unit (CPU) 232 coupled to the bus 228.

From the foregoing it will be appreciated that, although specific embodiments have been described herein for purposes of illustration, various modifications may be made without deviating from the spirit and scope of the present disclosure.

What is claimed is:

1. A Viterbi detector, comprising:
an input terminal configured to receive a signal that represents a binary sequence having pairs and only pairs of consecutive first logic levels and consecutive second logic levels; and
a recovery circuit coupled to the input terminal, the recovery circuit configured to recover the binary sequence from the signal by,
calculating a respective path metric for each of no more than two possible states of the binary sequence, and
determining a surviving path from the calculated path metrics, the binary sequence lying along the surviving path.

2. The Viterbi detector of claim 1, further comprising: a register coupled to the recovery circuit; and wherein the recovery circuit is configured to load the recovered binary sequence into the register.

3. The Viterbi detector of claim 1 wherein: the first logic level equals logic 1; and the second logic level equals logic 0.

4. The Viterbi detector of claim 1 wherein the recovery circuit is configured to recover the binary sequence from the signal by calculating a respective path metric for two and only two possible states of the binary sequence.

5. The Viterbi detector of claim 1 wherein the recovery circuit is configured to recover the binary sequence from the signal by calculating a respective path metric for and only for possible binary states 00 and 11.

6. The Viterbi detector of claim 1 wherein the recovery circuit is configured to recover the binary sequence from the signal according to a PR4 protocol.

7. The Viterbi detector of claim 1 wherein: the input terminal is configured to receive samples of the signal; and the recovery circuit is operable to process two samples at a time.

8. A Viterbi detector, comprising:
an input terminal configured to receive samples of a signal that represents a binary sequence having pairs and only pairs of consecutive logic 0's and logic 1's;
a register; and
a recovery circuit coupled to the input terminal and to the register, the circuit configured to recover the binary sequence from the signal by, for each pair of samples, calculating multiple path metrics for no more than two possible states of the binary sequence, and determining a surviving path from the calculated path metrics, the binary sequence lying along the surviving path.

9. The Viterbi detector of claim 8 wherein the recovery circuit is configured to recover the binary sequence from the signal by calculating, for each pair of samples, multiple path metrics for two of the possible binary states and only two of the possible binary states.

10. The Viterbi detector of claim 8 wherein the recovery circuit is configured to recover the binary sequence from the signal by: for each pair of samples, calculating multiple path metrics for the possible binary states 00 and 11 and only the possible binary states 00 and 11.

11. The Viterbi detector of claim 8 wherein the recovery circuit is configured to recover the binary sequence from the signal by: for each pair of samples, calculating no path metrics for the possible binary states 01 and 10; and for each pair of samples, calculating two respective path metrics for each of the possible binary states 00 and 11.

12. A Viterbi detector, comprising:
an input terminal configured to receive samples of a signal that represents a binary sequence having pairs and only pairs of consecutive logic 0's and logic 1's;
a register; and
a recovery circuit coupled to the input terminal and to the register, the recovery circuit configured to recover the binary sequence from the signal by, for each pair of samples, calculating a difference between path metrics for two possible states of the binary sequence, and determining a surviving path from the difference, the binary sequence lying along the surviving path.

13. The Viterbi detector of claim 12 wherein the recovery circuit is configured to recover the binary sequence from the signal by calculating, for each pair of samples, the difference and only the difference between the path metrics for the two possible states.

14. The Viterbi detector of claim 12 wherein the recovery circuit is configured to recover the binary sequence from the signal by calculation, for each pair of samples, of the difference between the path metrics for the two possible states 00 and 11.

15. The Viterbi detector of claim 12 wherein the recovery circuit is configured to recover the binary sequence from the signal by: for each pair of samples, calculating no path metrics for or difference metric between possible binary states 01 and 10; and for each pair of samples, calculating the difference between the path metrics for possible binary states 00 and 11.

16. A method, comprising:
calculating a respective path metric for each of no more than two possible states of a binary sequence having pairs and only pairs of consecutive first logic levels and consecutive second logic levels; and
determining a surviving path from the calculated path metrics, a recovered binary sequence lying along the surviving path.

17. The method of claim 16 wherein the calculating comprises calculating a respective path metric for and only for possible binary states 00 and 11 of the binary sequence.

18. A method, comprising:
sampling a signal that represents a binary sequence having pairs and only pairs of consecutive logic 0's and logic 1's;
for each pair of samples, calculating multiple path metrics for no more than two possible states of the binary sequence; and
determining a surviving path from the calculated path metrics, a recovered binary sequence lying along the surviving path.

19. The method of claim 18 wherein the calculating comprises, for each pair of samples: calculating no path metrics for the possible binary states 01 and 10; and calculating multiple two metrics for each of the possible binary states 00 and 11.

20. A method, comprising:
sampling a signal that represents a binary sequence having pairs and only pairs of consecutive logic 0's and logic 1's;
for each pair of samples, calculating a difference between path metrics for two possible states of the binary sequence; and
determining a surviving path from the difference, a recovered binary sequence lying along the surviving path.

21. The method of claim 20 wherein the calculating comprises, for each pair of samples: calculating no path metrics for or difference metric between possible binary states 01 and 10; and calculating the difference between the path metrics for possible binary states 00 and 11.

* * * * *